United States Patent [19]

Yamazaki et al.

[11] Patent Number: 5,731,613
[45] Date of Patent: Mar. 24, 1998

[54] SEMICONDUCTOR DEVICE HAVING A MONOCRYSTALLINE LAYER COMPOSED OF CARBON, OXYGEN, HYDROGEN AND NITROGEN ATOMS

[75] Inventors: Shunpei Yamazaki, Tokyo; Satoshi Teramoto, Kanagawa, both of Japan

[73] Assignee: Semiconductor Energy Laboratory Co., Ltd., Kanagawa-ken, Japan

[21] Appl. No.: 513,090

[22] Filed: Aug. 9, 1995

[30] Foreign Application Priority Data

Aug. 19, 1994 [JP] Japan .................................. 6-218077

[51] Int. Cl.$^6$ .......................... H01C 29/04; H01C 27/01
[52] U.S. Cl. .................. 257/350; 257/52; 257/55; 257/56; 257/58; 257/62; 257/63; 257/69; 257/347
[58] Field of Search ......................... 257/52–59, 62–64, 257/69, 347, 350, 352, 369

[56] References Cited

U.S. PATENT DOCUMENTS

| | | |
|---|---|---|
| 5,147,826 | 9/1992 | Liu et al. . |
| 5,275,851 | 1/1994 | Fonash et al. . |
| 5,500,538 | 3/1996 | Yamazaki et al. ................. 257/72 |
| 5,581,092 | 12/1996 | Takemura ........................... 257/65 |

OTHER PUBLICATIONS

C. Hayzelden et al., "*In Situ* Transmission Electron Microscopy Studies of Silicide–Mediated Crystallization of Amorphous Silicon" (3 pages).

A.V. Dvurechenskii et al., "Transport Phenomena in Amorphous Silicon Doped by Ion Implantation of 3d Metals", *Akademikian Lavrentev Prospekt* 13, 630090 Novosibirsk 90, USSR. pp. 635–640.

T. Hempel et al., "Needle–Like Crystallization of Ni Doped Amorphous Silicon Thin Films", *Solid State Communications*, vol. 85, No. 11, pp. 921–924, 1993.

R. Kakkad et al., "Crystallized Si films by low–temperature rapid thermal annealing of amorphous silicon," *J. Appl. Phys.*, 65(5), Mar. 1, 1989, pp. 2069–2072.

G. Liu et al., "Polycrystalline silicon thin film transistors on Corning 7059 glass substrates using short time, low–temperature processing," *Appl. Phys. Lett.* 62(20), May 17, 1993, pp. 2554–2556.

G. Liu et al., "Selective area crystallization of amorphous silicon films by low–temperature rapid thermal annealing," *Appl. Phys. Lett.* 55(7), Aug. 14, 1989, pp. 660–662.

R. Kakkad et al., "Low Temperture Selective Crystallization of Amorphous Silicon," *Journal of Non–Crystalline Solids*, 115, 1989, pp. 66–68.

*Primary Examiner*—Sara W. Crane
*Assistant Examiner*—Fetsum Abraham
*Attorney, Agent, or Firm*—Sixbey, Friedman, Leedom & Ferguson, PC; Gerald J. Ferguson, Jr.; Eric J. Robinson

[57] ABSTRACT

Regions 106 which can be regarded as being monocrystalline are formed locally by irradiating with laser light, and at least the channel-forming region 112 is constructed using these regions. With thin-film transistors which have such a construction it is possible to obtain characteristics which are similar to those which employ monocrystals. Further, by connecting in parallel a plurality of such thin-film transistors it is possible to obtain characteristics which are effectively equivalent to those of a monocrystalline thin-film transistor in which the channel width has been increased.

38 Claims, 8 Drawing Sheets

SEMICONDUCTOR DEVICE HAVING A MONOCRYSTALLINE LAYER COMPOSED OF CARBON, OXYGEN, HYDROGEN AND NITROGEN ATOMS

BACKGROUND OF THE INVENTION

DESCRIPTION OF THE RELATED ART

In recent years research has been conducted into techniques for forming transistors which employ thin-film semiconductors on a glass or quartz substrate (referred to as thin-film transistors). In particular, techniques employing amorphous silicon as the thin-film semiconductor have been put to practical use, for use in active matrix-type liquid crystal display devices and the like.

However, thin-film transistors which employ amorphous silicon have the problem that their characteristics are poor. For example, if an improvement is required in the display function of an active matrix-type liquid crystal display device, the characteristics of thin-film transistors which employ amorphous silicon are too poor to achieve this.

Further, techniques are known for constructing thin-film transistors using crystalline silicon films in which amorphous silicon films have been crystallized. These techniques involve transforming an amorphous silicon film into a crystalline silicon film by performing heat treatment or irradiation with laser light after formation of the amorphous silicon film. Crystalline silicon films obtained by crystallizing amorphous silicon films generally have a multicrystalline construction or a microcrystalline construction.

By constructing thin-film transistors using crystalline silicon films it is possible to obtain much better characteristics than if amorphous silicon films are used. For example, considering the mobility, which is one index with which to evaluate the characteristics of thin-film transistors, with thin-film transistors employing amorphous silicon films the mobility is 1 cm$^2$/Vs or less, but with thin-film transistors employing crystalline silicon films, a value of approximately 100 cm$^2$/Vs can be achieved.

However, crystalline silicon films which are obtained by crystallizing amorphous silicon films have a multicrystalline construction, and there are a number of problems which result from crystal grain boundaries. For example, since some carriers migrate via crystal grain boundaries, there is the problem that voltage resistance is greatly limited. There is the further problem that under high speed operation, for example, variation and degradation of the characteristics is liable to occur. There is furthermore the problem that since some carriers migrate via crystal grain boundaries, there is a large leak current when the thin-film transistor is off.

Further, in order to construct active matrix-type liquid crystal display devices in a more integrated fashion it is desirable to form not only the pixel region but also the peripheral circuitry on a single glass substrate. In such cases the thin-film transistors which are arranged in the peripheral circuitry must be able to handle large currents in order to drive the many thousands of pixel transistors which are arranged in matrix form.

In order to obtain thin-film transistors which can handle large currents it is necessary to adopt a construction which has a wide channel. However, with thin-film transistors which employ polycrystalline silicon films or microcrystalline silicon films there is a problem that this cannot be realized even if the channel is widened, due to the problem of voltage resistance. There is the further problem that variations in the threshold voltage and the like are large, and they are therefore not practical.

SUMMARY OF THE INVENTION

The invention disclosed in the present specification aims to provide a thin-film transistor which is not affected by crystal grain boundaries.

Further, another aim of the invention disclosed in the present invention is to provide a thin-film transistor which has a large voltage resistance and with which it is possible to handle large currents.

Further, yet another object of the invention disclosed in the present specification is to provide a thin-film transistor with which there is no degradation or variation in the characteristics.

One invention disclosed in the present specification is a semiconductor device which employs a thin-film silicon semiconductor which is formed on a substrate which has an insulating surface, wherein the abovementioned thin-film silicon semiconductor has a region which can be regarded as being effectively monocrystalline, the abovementioned region constitutes at least part of an active layer, and the abovementioned region contains carbon and nitrogen atoms at a concentration of between $1 \times 10^{16}$ cm$^{-3}$ and $5 \times 10^{18}$ cm$^{-3}$, oxygen atoms at a concentration of between $1 \times 10^{17}$ cm$^{-3}$ and $5 \times 10^{19}$ cm$^{-3}$, and hydrogen atoms, which neutralize the unpaired bonds in the silicon, at a concentration of between $1 \times 10^{17}$ cm$^{-3}$ and $5 \times 10^{20}$ cm$^{-3}$.

With the abovementioned construction, a region which can be regarded as being effectively monocrystalline refers to a thin-film silicon semiconductor region which has a crystalline construction which is taken to be equal to the crystallinity of a monocrystalline silicon wafer. Specifically, a region which is regarded as being effectively monocrystalline is defined as being a region in which the Raman spectrum intensity ratio in comparison with the Raman spectrum for monocrystalline silicon is at least 0.8, the ratio of the full which at half maximum (relative values) is 2 or less, and at the same time there are effectively no crystal grain boundaries in said region.

Such a region which can be regarded as being effectively monocrystalline can be obtained using an amorphous silicon film as the starting film, and heating it or irradiating it with laser light. In particular, by introducing metal elements which promote crystallization of the silicon, it is possible to obtain the abovementioned region which can be regarded as being effectively monocrystalline, relatively easily over a large area.

One or more elements selected from Fe, Co, Ni, Ru, Rh, Pd, Os, Ir, Pt, Cu, Zn, Ag and Au can be used as the metal elements which promote crystallization of the silicon. These elements have the property that they penetrate into silicon, and they disperse within the silicon film when heat treatment or irradiation with laser light is effected. From among the abovementioned elements, Ni (nickel) is an element with which it is possible to obtain particularly striking effects.

It is important for the abovementioned metal elements to be contained in the final silicon film after completion of crystallization at a concentration of between $1 \times 10^{16}$ and $5 \times 10^{19}$ cm$^{-3}$. If the concentration of the metal elements is less than $1 \times 10^{16}$ cm$^{-3}$ then it is not possible to obtain crystallization-promoting effects, and if the concentration is more than $5 \times 10^{19}$ cm$^{-3}$ then the quality of the semiconductor is impaired.

The following methods can be used to form the region which can be regarded as being effectively monocrystalline within the silicon thin film. Firstly, an amorphous silicon film is formed on a glass substrate or a quartz substrate, after which a film containing nickel is formed on the surface of the amorphous silicon film. The film containing nickel may be one in which an extremely thin nickel film is formed by the sputtering method, for example, or a method may be adopted whereby the nickel element is disposed in contact with the surface of the amorphous silicon film by applying a solution containing nickel onto the surface of the amorphous silicon film.

Having introduced the nickel element into the amorphous silicon film the amorphous silicon film is crystallized by being heat treated. This heat treatment may be performed at a temperature of 600° C. or less due to the action of the nickel element. If a glass substrate is used as the substrate then it is preferable for the temperature of the heat treatment to be as low as possible, but in consideration of the efficiency of the crystallization process it is advantageous for the temperature to be 500° C. or more, preferably 550° C. or more. It should be noted that when a quartz substrate is used for the substrate, the heat treatment may be performed at a temperature of 800° C. or more, and it is possible to obtain a crystalline silicon film in a short time. The crystalline silicon film obtained by this process has a multicrystalline or microcrystalline form, and there are crystal grain boundaries within the film.

Then, by irradiating the sample with laser light, with the sample heated to a temperature of 450° C. or more, crystallization is promoted locally. By this process it is possible to form a region which can be regarded as being monocrystalline. When the laser light is being irradiated, it is important to heat the sample or the irradiated surface to a temperature of 450° C. or more. The heating temperature is preferably between 450° C. and 750° C., and in particular, when a glass substrate is being used as the substrate, between 450° C. and 600° C.

Further, another method which can be cited as a method for forming the region which can be considered to be monocrystalline is one in which an amorphous silicon film is formed, a metal element which promotes crystallization is introduced, and the region which can be considered to be monocrystalline is formed by irradiating with laser light without performing heat treatment. In this case also it is important to heat the sample to between 450° C. and 750° C. during the irradiation with laser light, and in particular if a glass substrate is being used for the substrate, to heat it to a temperature of between 450° C. and 600° C.

The significance of heating the sample during irradiation with laser light will now be explained. FIG. 4 shows the Raman spectrum intensity when laser light is irradiated onto an amorphous silicon film in which a base silicon oxide film has been formed on a glass substrate, an amorphous silicon film has been formed thereon and nickel element has been introduced onto the surface thereof. Further, each plotted point indicates the temperature to which the sample was heated when the laser light was irradiated.

The Raman intensities shown in FIG. 4 are relative values showing the ratio ($I/I_0$) between the Raman spectrum intensity $I_0$ of a monocrystalline silicon wafer and the Raman spectrum intensity I of the sample. The Raman spectrum intensity is defined as being the maximum value of the Raman spectrum intensity, as shown in FIG. 7. In general there are no crystalline constructions which exceed a monocrystalline silicon wafer, and therefore the maximum value of the Raman intensity shown on the vertical axis in FIG. 4 is 1. It can be seen that as the value of the Raman intensity approaches 1, the construction approaches a monocrystalline construction.

FIG. 5 shows plots of the relationship between the full width at half maximum for the Raman spectrum and the energy density of the laser light irradiation for samples heated to different temperatures. The full width at half maximum shown on the vertical axis is a parameter indicating the ratio ($W/W_0$) between the width $W_0$ of the spectrum at a position at half of the Raman spectrum intensity for a monocrystalline silicon wafer and the width W of the spectrum at a position at half of the Raman spectrum intensity which was actually obtained for the sample. W and $W_0$ are defined as the width of the spectrum at a position of half of the Raman spectrum intensity, as shown in FIG. 7. In general, a narrow, sharp Raman spectrum means that the crystallinity is excellent. Consequently, in general the width of the Raman spectrum for monocrystalline silicon is the thinnest and the sharpest. It should be noted that the samples which were used were the same as those for which the data shown in FIG. 4 was obtained.

Thus the full width at half maximum shown in FIG. 5 is generally a value of 1 or more. It can further be seen that as the value approaches 1, the construction approaches a monocrystalline construction. As can be seen from FIG. 5, it is possible to obtain a crystallinity which approaches that of a monocrystal if the temperature to which the sample is heated during irradiation with laser light is increased. It can further be seen that the effects due to heating the sample become saturated at about 500° C. It can be concluded from FIG. 5 that in order to obtain stable crystallinity which approaches that of a monocrystal, heating to 400° C. is not reliable, and it is therefore preferable to heat to 450° C. or more in order to provide some leeway.

In the opinion of the present inventors, a region can be regarded as being monocrystalline if the Raman intensity shown in FIG. 4 is 0.8 or more, the full width at half maximum of the Raman spectrum shown in FIG. 5 is 2.0 or less, and there are effectively no crystal grain boundaries within the region.

The region which can be regarded as being monocrystalline is one in which a silicon film formed by the plasma CVD method or the reduced pressure thermal CVD method is used as the starting film, and the film contains carbon and nitrogen at a concentration of between $1\times10^{16}$ and $5\times10^{18}$ cm$^{-3}$ and oxygen at a concentration of between $1\times10^{17}$ and $5\times10^{19}$ cm$^{-3}$. Further, lattice defects are present in principle, and therefore hydrogen is contained at a concentration of between $1\times10^{17}$ and $5\times10^{20}$ cm$^{-3}$ in order to neutralize unpaired bonds in the silicon. In other words a characteristic of the region which can be regarded as being monocrystalline is that although it has point defects it does not have linear defects or surface defects. It should be noted that the concentrations of elements which are contained is defined as being the minimum value as measured by SIMS (secondary ion mass spectroscopy).

The abovementioned region which can be regarded as being monocrystalline is different from a general monocrystalline wafer. This results from its being a thin-film semiconductor with a thickness of between approximately 200 and 2000 Å which is formed by the CVD method.

The construction of another invention is a semiconductor device which employs a thin-film silicon semiconductor which is formed on a substrate which has an insulating surface, wherein the abovementioned thin-film silicon semiconductor has a region which can be regarded as being effectively monocrystalline, the abovementioned region constitutes at least part of an active layer, and the abovementioned region contains carbon and nitrogen atoms at a concentration of between $1 \times 10^{16}$ cm$^{-3}$ and $5 \times 10^{18}$ cm$^{-3}$, and oxygen at a concentration of between $1 \times 10^{17}$ cm$^{-3}$ and $5 \times 10^{19}$ cm$^{-3}$.

The construction of another invention is a semiconductor device which employs a thin-film silicon semiconductor which is formed on a substrate which has an insulating surface, wherein the abovementioned thin-film silicon semiconductor has a region which can be regarded as being effectively monocrystalline, the abovementioned region constitutes at least part of an active layer, and the abovementioned region contains hydrogen atoms, which neutralize the unpaired bonds in the silicon, at a concentration of between $1 \times 10^{17}$ cm$^{-3}$ and $5 \times 10^{20}$ cm$^{-3}$.

The construction of another invention is a semiconductor device which employs a thin-film silicon semiconductor which is formed on a substrate which has an insulating surface, wherein the abovementioned thin-film silicon semiconductor has a region which can be regarded as being effectively monocrystalline, the abovementioned region constitutes at least part of an active layer, the abovementioned region contains carbon and nitrogen atoms at a concentration of between $1 \times 10^{16}$ cm$^{-3}$ and $5 \times 10^{18}$ cm$^{-3}$, oxygen atoms at a concentration of between $1 \times 10^{17}$ cm$^{-3}$ and $5 \times 10^{19}$ cm$^{-3}$, and hydrogen atoms, which neutralize the unpaired bonds in the silicon, at a concentration of between $1 \times 10^{17}$ cm$^{-3}$ and $5 \times 10^{20}$ cm$^{-3}$, and the thickness of the abovementioned thin-film silicon semiconductor is on average between 200 and 2000 Å.

The construction of another invention is a semiconductor device which employs a thin-film silicon semiconductor which is formed on a substrate which has an insulating surface, wherein a region of the abovementioned thin-film silicon semiconductor which has a crystalline construction which can be regarded as being effectively monocrystalline constitutes at least a channel-forming region, and the abovementioned channel-forming region contains carbon and nitrogen atoms at a concentration of between $1 \times 10^{16}$ cm$^{-3}$ and $5 \times 10^{18}$ cm$^{-3}$, oxygen atoms at a concentration of between $1 \times 10^{17}$ cm$^{-3}$ and $5 \times 10^{19}$ cm$^{-3}$, and hydrogen atoms, which neutralize the unpaired bonds in the silicon, at a concentration of between $1 \times 10^{17}$ cm$^{-3}$ and $5 \times 10^{20}$ cm$^{-3}$.

The construction of another invention is a method of fabricating a semiconductor device, which method comprises a step in which a region which can be regarded as being monocrystalline is formed by irradiating with laser light a silicon thin film which is formed on a substrate which has an insulating surface, wherein the abovementioned laser light irradiation is performed in a state in which the sample has been heated to a temperature of between 450° C. and 750° C.

The construction of another invention is a semiconductor device which has a construction in which a plurality of thin-film transistors are connected in parallel, and each of the abovementioned plurality of thin-film transistors has a construction in which there are effectively no crystal grain boundaries within the channel-forming region.

The construction of another invention is a semiconductor device which has a construction in which a plurality of thin-film transistors are connected in parallel, each of the abovementioned plurality of thin-film transistors has a construction in which there are effectively no crystal grain boundaries within the channel-forming region, and the abovementioned channel-forming region contains carbon and nitrogen atoms at a concentration of between $1 \times 10^{16}$ cm$^{-3}$ and $5 \times 10^{18}$ cm$^{-3}$, oxygen atoms at a concentration of between $1 \times 10^{17}$ cm$^{-3}$ and $5 \times 10^{19}$ cm$^{-3}$, and hydrogen atoms, which neutralize the unpaired bonds in the silicon, at a concentration of between $1 \times 10^{17}$ cm$^{-3}$ and $5 \times 10^{20}$ cm$^{-3}$.

The construction of another invention is a semiconductor device which has a construction in which a plurality of thin-film transistors are connected in parallel, each of the abovementioned plurality of thin-film transistors has a construction in which there are effectively no crystal grain boundaries within the channel-forming region, the abovementioned channel-forming region has a thickness of between 200 and 2000 Å, and the abovementioned channel-forming region contains carbon and nitrogen atoms at a concentration of between $1 \times 10^{16}$ cm$^{-3}$ and $5 \times 10^{18}$ cm$^{-3}$, oxygen atoms at a concentration of between $1 \times 10^{17}$ cm$^{-3}$ and $5 \times 10^{19}$ cm$^{-3}$, and hydrogen atoms, which neutralize the unpaired bonds in the silicon, at a concentration of between $1 \times 10^{17}$ cm$^{-3}$ and $5 \times 10^{20}$ cm$^{-3}$.

The construction of another invention is a semiconductor device which has a construction in which a plurality of thin-film transistors are connected in parallel, and each of the abovementioned plurality of thin-film transistors is constructed from a thin-film silicon semiconductor in which the channel-forming region can be regarded as being effectively monocrystalline.

By constructing a thin-film transistor using, as the active layer, a region of a thin-film semiconductor transistor which region can be regarded as being monocrystalline, it is possible to obtain a thin-film transistor which has high voltage resistance and in which there is no variation or degradation of characteristics.

Further, by adopting a construction in which there are connected in parallel a plurality of thin-film transistors which are constructed using, as the active region, a region of a thin-film silicon semiconductor which region can be regarded as being monocrystalline, it is possible to obtain a construction with which it is possible to allow a large current to flow. With such constructions it is possible to obtain effects which are effectively the same as those obtained by increasing the channel width. By adopting this construction it is possible to obtain the same characteristics as with a transistor which is formed using a semiconductor which can be regarded as being monocrystalline, and it is possible to obtain a large mobility, a large voltage resistance and stabilized characteristics.

DESCRIPTION OF THE PREFERRED EMBODIMENTS

[Embodiment 1]

Figure 1A:
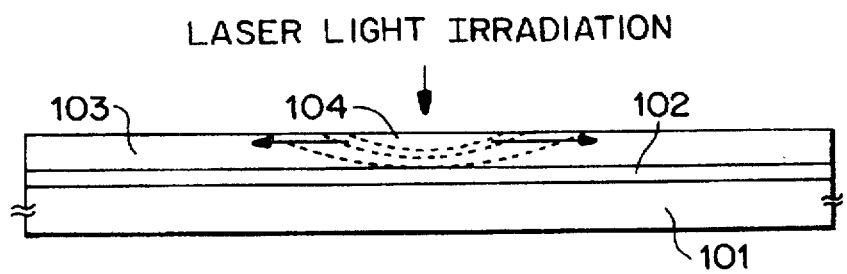
FIGS. 1(A) to 1(D) show the fabrication steps of an embodiment of a thin-film transistor.
Figure 1B:
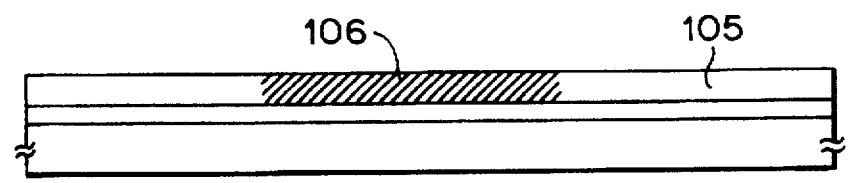
Figure 1C:
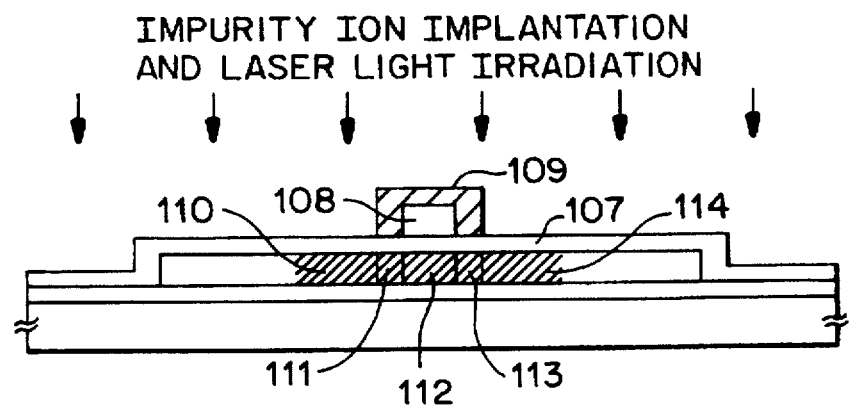

The present embodiment employs a glass substrate (Corning 7059) as the substrate, and is an example in which a thin-film transistor is fabricated at a temperature which is lower than the distortion temperature of the glass substrate. The distortion temperature of Corning 7059 glass is 593° C., and therefore heat treatments at temperatures above this temperature are not preferable since they give rise to shrinkage and deformation of the glass substrate. In particular, if use is made of a glass substrate which has a large surface area, for use in a particularly large liquid crystal display device, shrinkage and deformation of the glass substrate have significant effects.

Thus the thin-film transistor shown in the present embodiment is characterized in that the effects of heat on the substrate are greatly reduced by the maximum temperature in the heat treatment step being 600° C. or less, and preferably 550° C. or less.

FIG. 1 shows the fabrication steps for the thin-film transistor given in the present embodiment. Firstly, a silicon oxide film 102 is formed by the sputtering method to a thickness of 3000 Å on a quartz substrate 101 as a base film. An amorphous silicon film 103 is then formed by the plasma CVD method or the low-pressure thermal CVD method to a thickness of 500 Å. (FIG. 1(A))

After forming the amorphous silicon film 103, heat treatment is performed at a temperature of 600° C., thereby crystallizing the amorphous silicon film 103. Laser light is then irradiated, crystal growth is effected centered on the region indicated by 104, and a crystalline region 106 which can be regarded as being monocrystalline is obtained. The laser light irradiation is performed while the sample or surface being irradiated is heated to a temperature of 600° C. The laser light irradiation is performed in the region indicated by 104 in FIG. 1, and at this time crystal growth proceeds outwards from the region indicated by 104. (FIG. 1(A))

In the abovementioned step, it is advantageous to introduce into the amorphous silicon film a metal element which promotes crystallization. In this way it is possible to form a region which can be regarded as being monocrystalline over a larger surface area.

Having obtained the region 106 which can be regarded as being monocrystalline, the active layer of the thin-film transistor is formed by patterning, using this region. Most preferably the whole of the active layer is formed within the region which can be regarded as being monocrystalline. However, depending on the size of the active layer, there are cases in which the resulting monocrystalline region is relatively small, and it is difficult to construct the whole of the active layer. In these cases it is possible to arrange that there are no crystal grain boundaries within the channel-forming region by making the channel-forming region the region which can be regarded as being monocrystalline.

Having formed the active layer, a silicon oxide film 107 is formed as a gate insulating film to a thickness of 1000 Å using the plasma CVD method A film whose main component is aluminum, containing 0.2% scandium, is then formed to a thickness of 6000 Å. A gate electrode 108 is then obtained by patterning the film whose main component is aluminum.

An oxide layer 109 is then formed by performing anodic oxidation using the gate electrode 108 as the anode, in an ethylene glycol solution containing 10% tartaric acid. The thickness of the oxide layer 109 is approximately 2000 Å. Due to the presence of the oxide layer it is possible to form offset gate regions in the subsequent step in which impurity ions are injected.

Impurity ions, phosphorus ions for an N-channel type thin-film transistor, or boron ions for a P-channel type thin-film transistor, are then injected into the active layer. In this step, the gate electrode 108 and the oxide layer 109 at the periphery thereof act as a mask, and impurity ions are injected into the regions indicated by 110 and 114. The region 110 in which impurity ions have been injected then forms the source region, and the region 114 forms the drain region. Further, the oxide layer 109 at the periphery of the electrode 108 acts as a mask, and offset gate regions 111 and 113 are formed simultaneously. Further, a channel-forming region 112 is also formed in a self-aligning manner. (FIG. 1(C))

After completion of the impurity ion injection step, laser light is irradiated, thereby annealing the active layer which was damaged by the injection of the impurity ions, and activating the injected impurities. This step may also be performed by irradiating with strong light such as infrared light.

Further, a silicon oxide film 115 is formed to a thickness of 7000 Å by the plasma CVD method as a layer insulating film. After passing through a hole-opening step, a source electrode 116 and a drain electrode 117 are formed. Further, by performing heat treatment in a hydrogen atmosphere at 350° C. the thin-film transistor is completed. (FIG. 1(D))

In the thin-film transistor shown in the present embodiment, the active layer is constructed from a region which has a construction which can be regarded as being monocrystalline, and it is therefore possible to solve the problems of low voltage resistance resulting from crystal grain boundaries, and the problem of a large leak current.

[Embodiment 2]

The present embodiment indicates an example in which a thin-film transistor is constructed using a crystalline region which can be regarded as being monocrystalline, said region being formed by introducing into an amorphous silicon film a metal element which promotes crystallization.

FIG. 2 shows the fabrication steps in the present embodiment. Firstly, a silicon oxide film 102 is formed to a thickness of 3000 Å by the sputtering method on a glass substrate 101 as a base film. An amorphous silicon film 103 is then formed to a thickness of 1000 Å by the plasma CVD method or the reduced-pressure thermal CVD method. An extremely thin oxide film (not shown) is then formed on the surface of the amorphous silicon film by the UV oxidation method. This oxide film is intended to improve solution wetting in the subsequent solution application step. The UV oxidation step which is performed here involves irradiation with UV light in an oxidizing atmosphere, thereby forming an extremely thin oxide film on the surface of the surface which is being irradiated.

A nickel acetate solution is then coated by the spin coating method onto the surface of the amorphous silicon film 103 on which is formed the extremely thin oxide film, thereby forming a film 100 containing nickel. Due to the presence of the film 100, the nickel element is disposed in contact with the amorphous silicon film via the extremely thin oxide film.

In this state the amorphous silicon film 103 is transformed into a crystalline silicon film by subjecting it to heat treatment at 550° C. for 4 hours. Here, since nickel, which is a metal element which promotes crystallization, has been introduced, it is possible to obtain a crystalline silicon film by heat treating at 550° C. for approximately 4 hours.

Having obtained the silicon film 103 which has been transformed into a crystalline silicon film by heat treatment, crystal growth is effected from the region indicated by 104 in FIG. 2 by irradiating with laser light. In the present embodiment, nickel, which is a metal element which promotes crystallization, has been introduced, and it is therefore possible to obtain a region which can be regarded as being monocrystalline, as indicated by 106, simply.

Figure 2A:
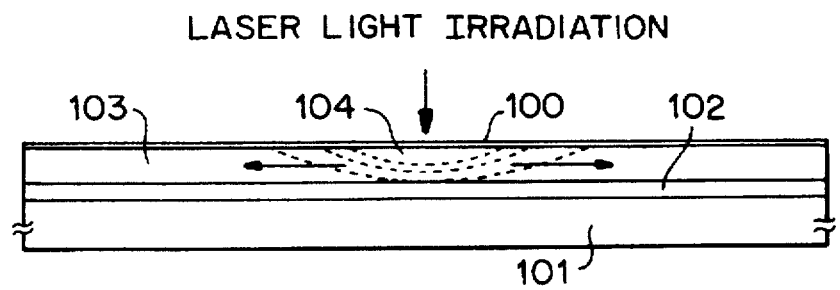
FIGS. 2(A) to 2(D) show the fabrication steps of an embodiment of a thin-film transistor.
Figure 2B:
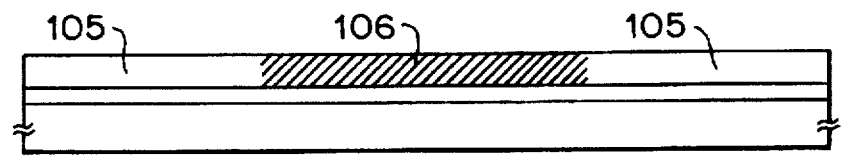

Having thus obtained the region 106 which can be regarded as being monocrystalline, as indicated in FIG. 2(B), the active layer of the thin-film transistor is formed using this region. Further, the film containing nickel is removed before or after formation of the active layer.

Having formed the active layer, a gate insulating layer 107 is constructed from a silicon oxide film, and furthermore a gate electrode 108 whose main component is aluminum, and an oxide layer 109 at the periphery thereof are formed. These fabrication steps are the same as indicated in embodiment 1.

Figure 2C:
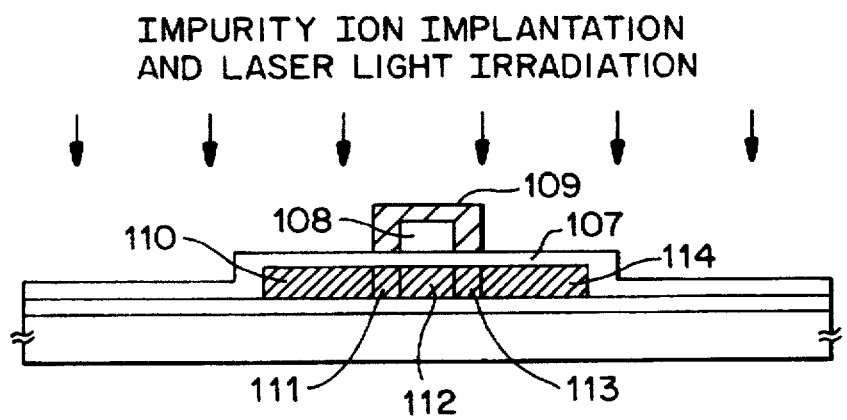

Having obtained the state shown in FIG. 2(C) in this way, impurity ions are injected, and a source region 110 and a drain region 114 are formed. In this step, offset gate regions 111 and 113, and also a channel-forming region 112 are formed in a self-aligning manner.

Furthermore, by irradiating with laser light, damage caused when the impurity ions were injected is annealed, and impurity ions which have been injected are activated.

Figure 2D:
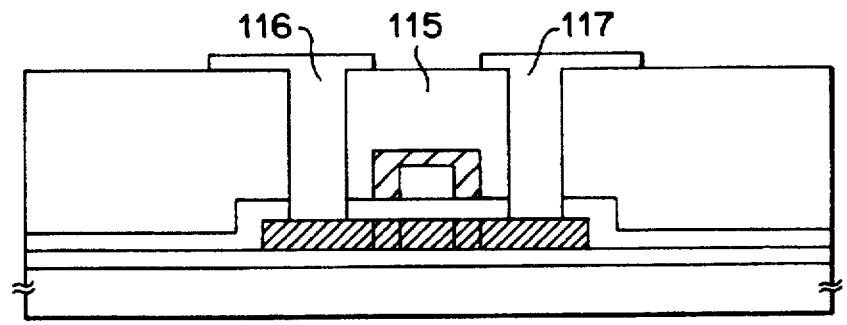

A silicon oxide film 115 is then formed as a layer insulating film by the plasma CVD method, and after passing through a hole-opening step, a source electrode 116 and a drain electrode 117 are formed. Finally, by heat treating for 1 hour in a hydrogen atmosphere at 350° C., the thin-film transistor shown in FIG. 2(D) is completed.

[Embodiment 3]

The present embodiment relates to a construction in which the inventions disclosed in the present specification are employed in a thin-film transistor which is required to handle large currents. For example, in the peripheral circuitry of an active matrix-type liquid crystal display device, a buffer amplifier (a power conversion circuit which has a low output impedance) through which large currents can flow is required in order to drive the many thousands of pixel transistors which are provided. For cases in which not only the display region but also the peripheral circuitry region is to be integrated on a single substrate, there is the need to construct the buffer amplifier using thin-film transistors.

In order to construct a thin-film transistor which can be used in such a buffer amplifier, it is necessary for the channel-forming region of the thin-film transistor to have a width of several tens of micrometers or more. However, if crystalline silicon thin films which have a general multicrystalline or microcrystalline construction are used, the voltage resistance is low, and there are problems in that it is difficult to construct the required buffer amplifier. Further, when high speed operations are performed, there is the problem that variations and drift of the characteristics are liable to occur. This is due to the fact that the threshold value in each transistor varies, and characteristics are likely to be degraded. Further, there are serious problems of heat generation, and there are also problems in that the characteristics are degraded by the effects of heat generation. The main reason for these problems is that crystal grain boundaries exist within the active layer (in particular within the channel-forming region).

Thus the present embodiment provides a construction in which there are connected in parallel a plurality of thin-film transistors in each of which the channel-forming region is constructed using a region which can be regarded as being monocrystalline, and with which it is possible to handle currents of a size similar to thin-film transistors which have an equivalently large channel width.

Figure 3:
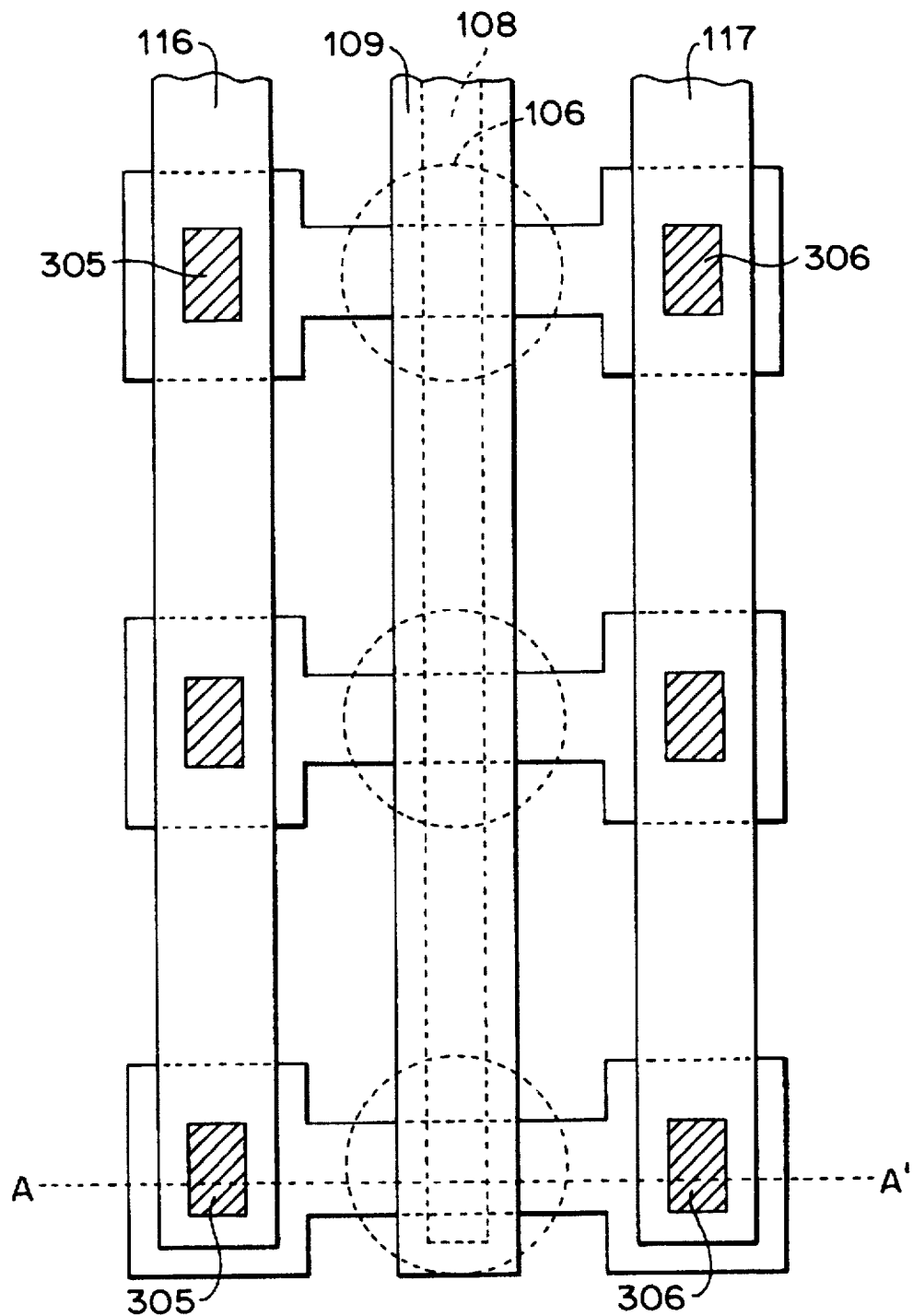
FIG. 3 shows the construction of an embodiment of a thin-film transistor.
Figure 4:
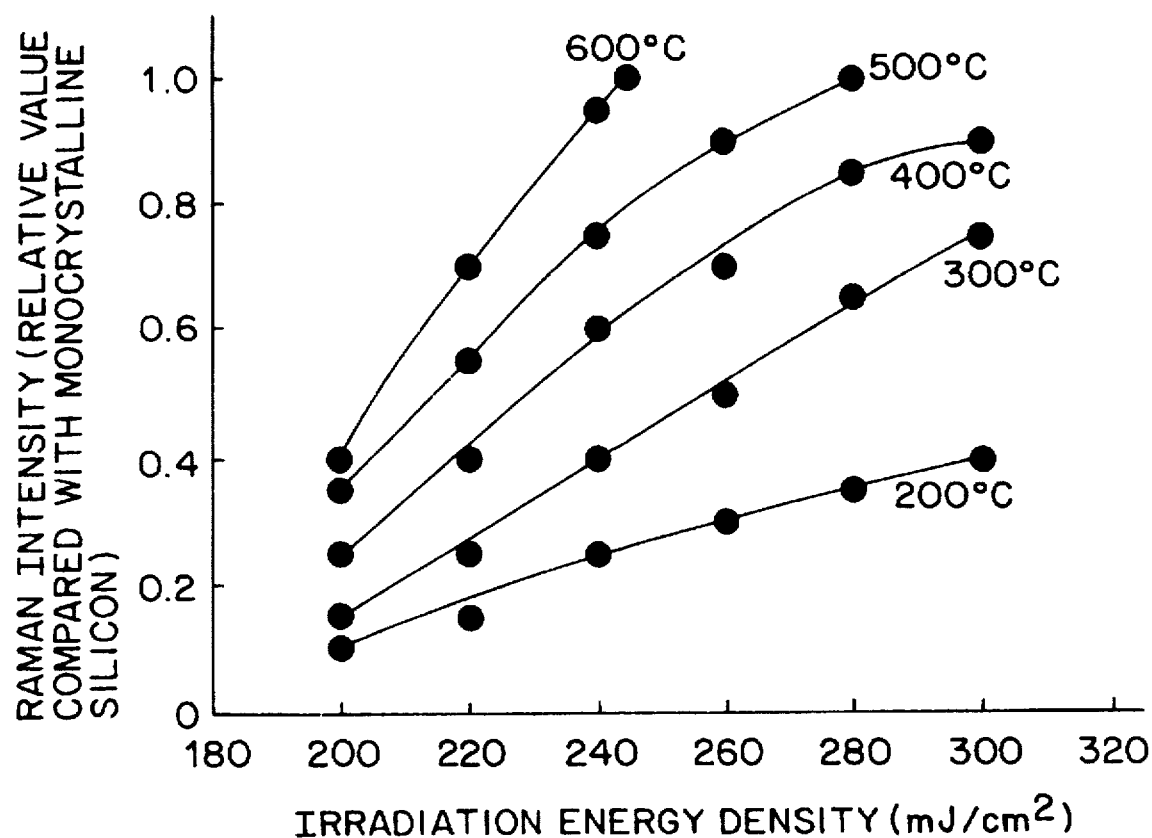
FIG. 4 shows the relationship between the energy density of laser light irradiation and the Raman intensity for cases in which the temperature to which the sample is heated varies.
Figure 5:
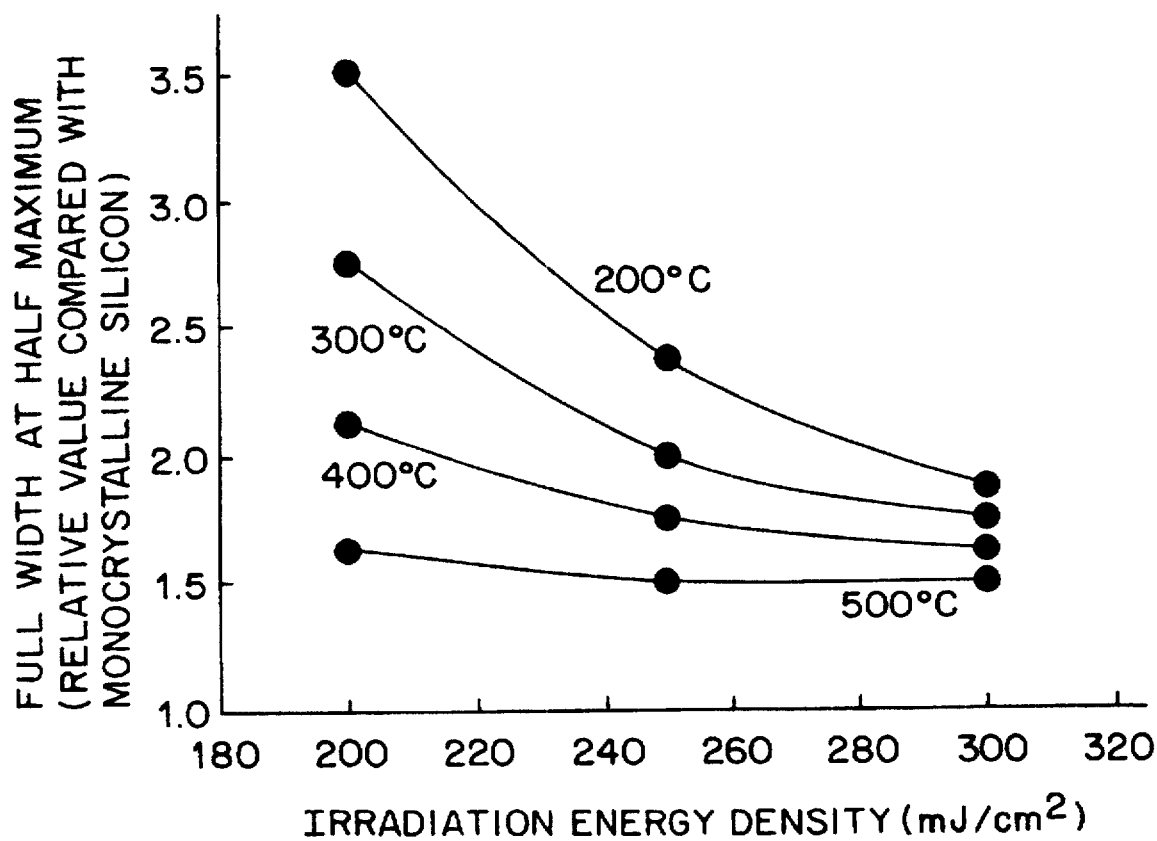
FIG. 5 shows the relationship between the energy density of laser light irradiation and the full width at half magnitude of the Raman spectrum for cases in which the temperature to which the sample is heated varies.

FIG. 3 shows the construction of a thin-film transistor indicated in the present embodiment. The construction given in the present embodiment shows a construction in which three thin-film transistors are connected in parallel. The construction shown in FIG. 3 is a construction in which the active layer forming the channel-forming region and periphery thereof in each thin-film transistor is constructed from a silicon semiconductor thin-film which can be regarded as being monocrystalline.

In FIG. 3, the regions indicated by 106 are regions which can be regarded as being monocrystalline. The regions which can be regarded as being monocrystalline, indicated by 106, include part of the channel-forming region and source/drain regions. It is therefore possible to construct not only the channel-forming region, but also the interface between the source region and the channel-forming region and the vicinity thereof, and the interface between the drain region and the channel-forming region and the vicinity thereof such that they can be regarded as being monocrystalline.

When such a construction is adopted, it is possible to solve the problems which arise due to the presence of crystal grain boundaries. In other words, it is possible to solve the problem of low voltage resistance, the problem of degradation of characteristics and the problem of variations in threshold values. Further, since it is possible to reduce the number of carriers which migrate between the source and drain via the crystal grain boundaries it is possible to reduce the off current.

Figure 1D:
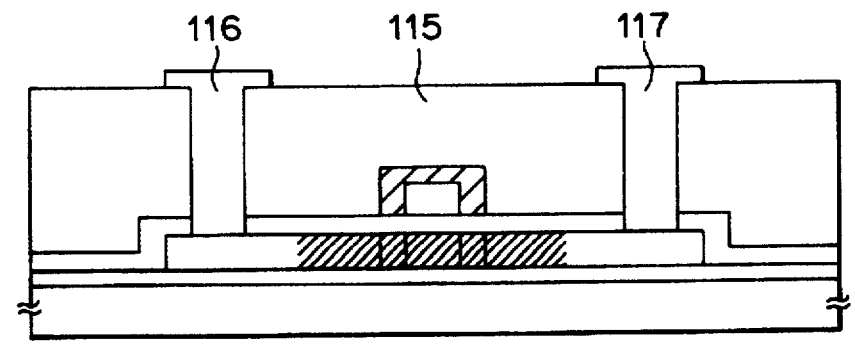

The cross section through A–A$^7$ of the construction shown in FIG. 3 corresponds to FIG. 1(D). In other words, the construction shown in FIG. 3 has a construction in which three thin-film transistors shown in FIG. 1(D) are connected in parallel. Each transistor has a common gate electrode, and the source electrode and drain electrode are wired in common by contacts 305 and 306.

If the construction shown in the present embodiment is adopted, it is possible to perform operations equivalent to using a thin-film transistor which has a channel width of 60 µm, even though the channel width of each thin-film transistor is 20 µm, by connecting three thin-film transistors in parallel.

The present embodiment shows an example in which three thin-film transistors are connected in parallel. However, the number of thin-film transistors which are connected in parallel can be selected as necessary.

By adopting a construction such as shown in the present embodiment it is possible to obtain a thin-film transistor which has characteristics which are similar to a thin-film transistor which employs a semiconductor which can be regarded as being monocrystalline, and which can handle large currents. It is therefore possible to perform high speed operations, and it is furthermore possible to achieve a construction with which there is no degradation or variation of characteristics.

The construction shown in the present embodiment can be said to be ideal for circuits which require a large current to flow, for example buffer circuits which are provided in the peripheral circuitry of active matrix-type liquid display devices.

[Embodiment 4]

Figure 6:
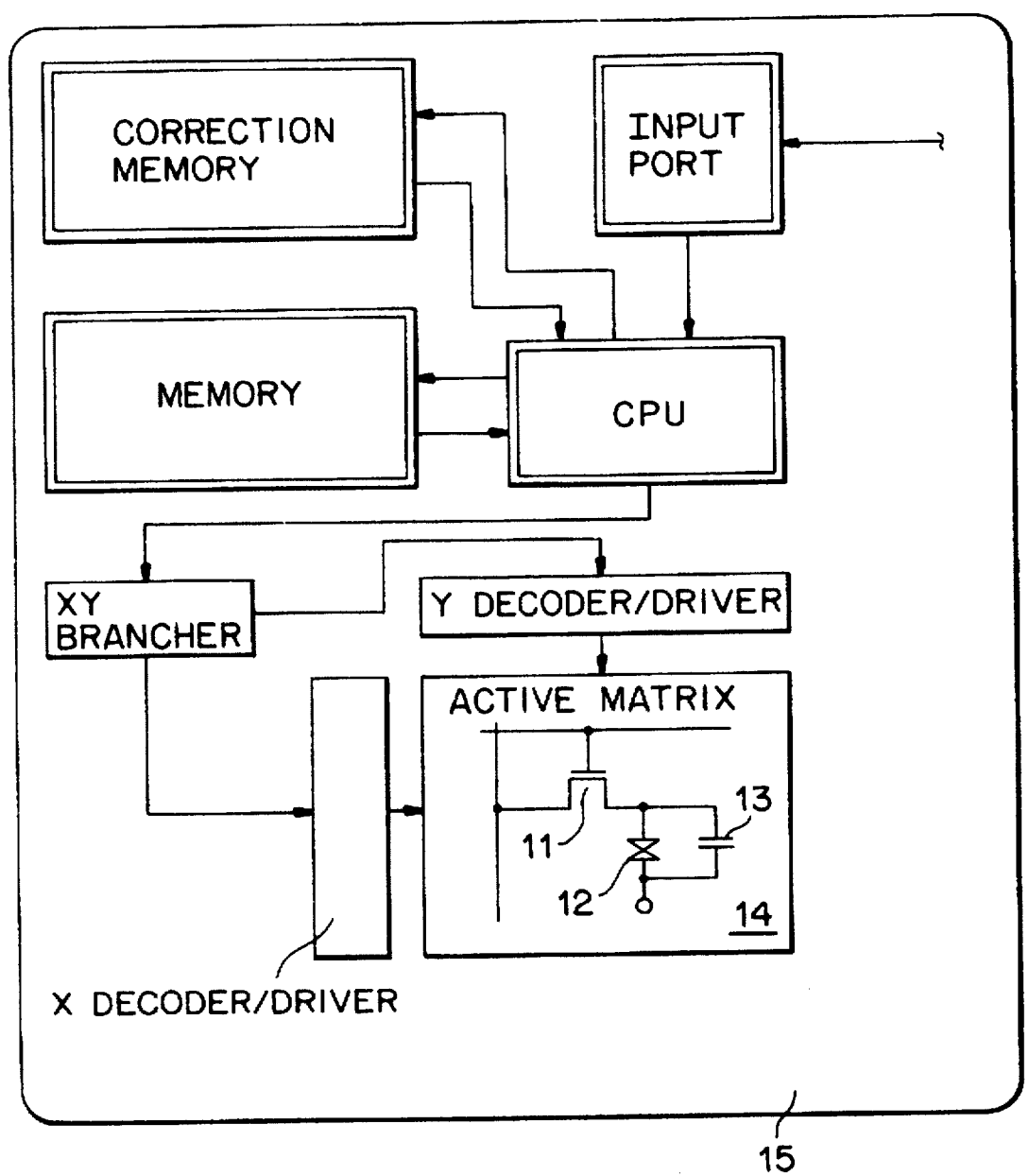
FIG. 6 shows an example of a liquid crystal electrooptical device which is integrated on a single substrate.
Figure 7:
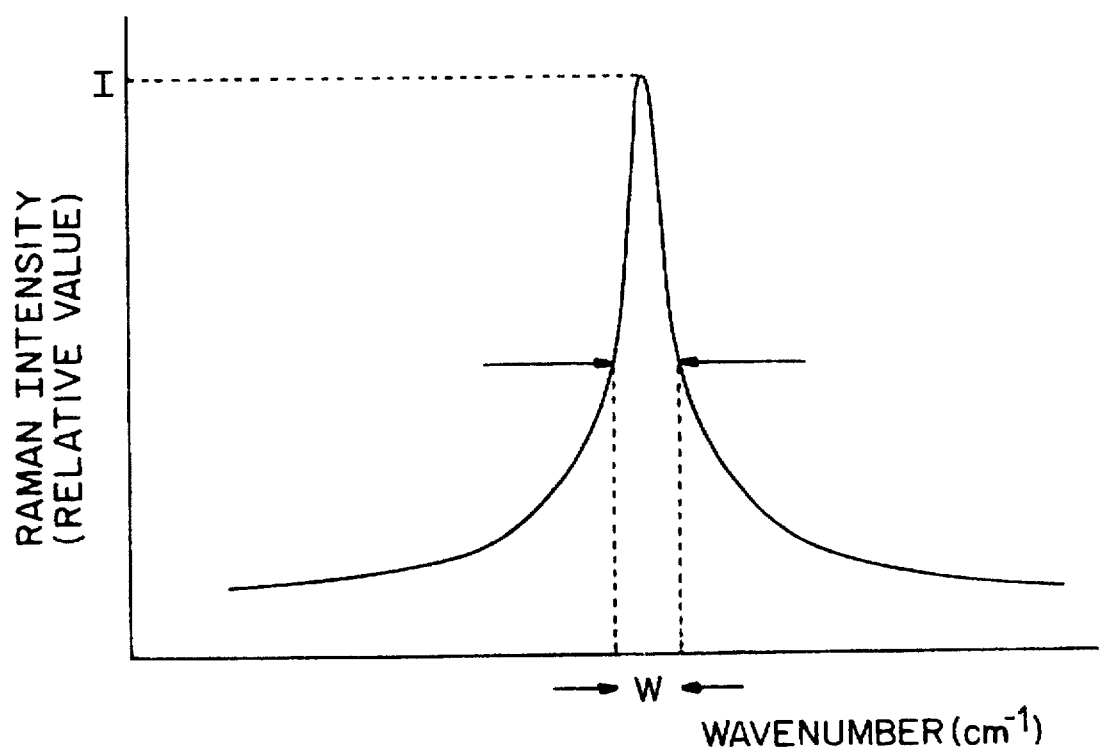
FIG. 7 shows an example of a Raman spectrum.

FIG. 6 shows the architecture of a high-accuracy active matrix liquid crystal display system which employs the invention disclosed in the present specification. The example shown in FIG. 6 is an example which has been made small, lightweight and thin by fixing semiconductor chips which are normally attached to the main board of a computer onto at least one of the substrates of a liquid crystal display which has a construction in which liquid crystal is sandwiched between a pair of substrates.

A description of FIG. 6 will now be given. The substrate 15 is a substrate of a liquid crystal display, and an active matrix circuit 14 which is formed from a number of pixels which are provided with a TFT 11, a pixel electrode 12 and an auxiliary capacitor 13, an X decoder/driver, a Y decoder/driver and an XY branching circuit are formed on the substrate 15 using TFTs. In order to drive the active matrix circuit, a buffer circuit which has a low output impedance must be provided in the peripheral circuit, and this buffer circuit is advantageously constructed using a circuit such as shown in FIG. 3.

Other chips are also attached to the substrate 15. These chips are connected to the circuitry on the substrate 15 by a means such as the wire bonding method or the COG (chip on glass) method. In FIG. 6, the chips which are attached in this way are the correction memory, the memory, the CPU and the input board, but various other chips may also be attached.

In FIG. 6, the input board is a circuit which reads signals which have been input from outside, and converts them into image signals. The correction memory is a memory which is unique to the active matrix panel and is used to correct input signals and the like in order to match them to the characteristics of the panel. In particular, the correction memory uses nonvolatile memory for information unique to each pixel, and corrects them individually. In other words, if there is a point defects in a pixel of an electrooptical device then signals are sent to pixels around this point to match with it, thereby covering the point defect such that the defect is not noticeable. Further, if a pixel is darker than the surrounding pixels then a larger signal is sent to that pixel such that it has the same brightness as the surrounding pixels. The defect information for pixels is different for each panel, and therefore the information stored in the correction memory is different for each panel.

The functions of the CPU and memory are the same as for a normal computer, and in particular memory is provided as RAM for the image memory corresponding to each pixel. All of these chips are CMOS type.

It is further possible to increase the thin film of the system by constructing at least part of the required integrated circuits using the inventions disclosed in the present specification.

In this way, forming even the CPU and memory on the liquid crystal display substrate, and constructing an electronic device such as a simple personal computer on a single substrate is extremely advantageous in reducing the size of liquid crystal display systems and widening their scope of application.

It is possible to use the thin-film transistors fabricated using the inventions disclosed in the present specification for circuits which are required in systemized liquid crystal displays. In particular, it is extremely advantageous to use thin-film transistors fabricated using regions which can be regarded as being monocrystalline in analog buffer circuits or other necessary circuits.

[Embodiment 5]

Figure 8:
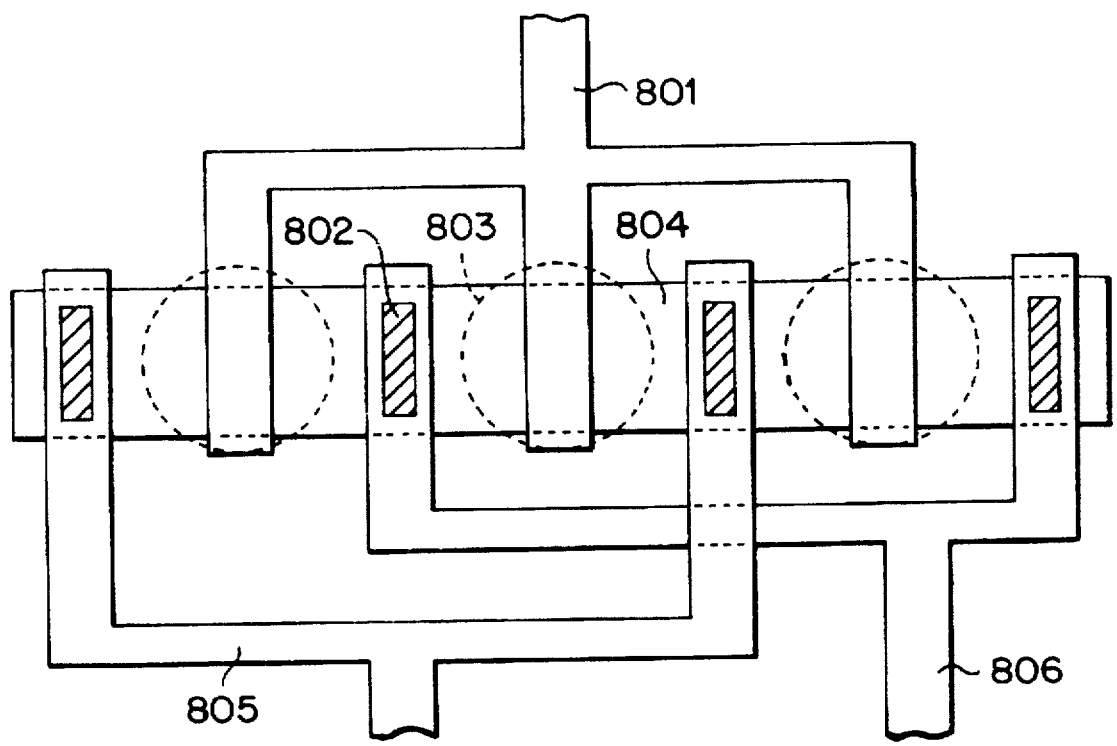
FIG. 8 shows the construction of an embodiment of a thin-film transistor.

The present embodiment relates to a construction in which three thin-film transistors are connected in parallel as shown in FIG. 8. In FIG. 8, 804 indicates a common active layer, and 803 is a region which can be regarded as being monocrystalline and which is formed in the active layer. In FIG. 8, three regions which can be regarded as being monocrystalline are shown, and the channel-forming regions of each thin-film transistor are formed in the three regions which can be regarded as being monocrystalline.

801 is a common gate electrode and gate wiring. 805 is a common source electrode and source wiring. 806 is a common drain electrode and drain wiring. Further, 802 indicates contact portions between the source/drain electrodes and the source/drain regions.

By employing the inventions disclosed in the present specification it is possible to obtain a thin-film transistor which is not affected by crystal grain boundaries. It is further possible to obtain a thin-film transistor which has high voltage resistance and with which there is no variation in characteristics, and with which it is possible to handle large currents. Further, since it is possible for the operation of the thin-film transistor not to be affected by crystal grain boundaries, it is possible for the off current to have a small characteristic.

What is claimed is:

1. A semiconductor device which employs a thin-film silicon semiconductor which is formed on an insulating surface, wherein
   the thin-film silicon semiconductor has a region which can be regarded as being effectively monocrystalline,
   the region constitutes at least part of an active layer,
   and the region contains carbon and nitrogen atoms at a concentration of $5\times10^{18}$ cm$^{-3}$ or less, oxygen atoms at a concentration of $5\times10^{19}$ cm$^{-3}$ or less, and hydrogen atoms, which neutralize the unpaired bonds in the silicon, at a concentration of $5\times10^{20}$ cm$^{-3}$ or less,
   wherein Raman spectrum intensity ratio of the region in comparison with the Raman spectrum for monocrystalline silicon is at least 0.8.

2. The device of claim 1 wherein the region which has a crystalline construction which can be regarded as being effectively monocrystalline contains one or more metal elements which promote crystallization of the silicon, selected from Fe, Co, Ni, Ru, Rh, Pd, Os, Ir, Pt, Cu, Zn, Ag and Au.

3. The device of claim 1 wherein the region which has a crystalline construction which can be regarded as being effectively monocrystalline contains, at a concentration of between $1\times10^{16}$ and $5\times10^{19}$ cm$^{-3}$ one or more metal elements which promote crystallization of the silicon, selected from Fe, Co, Ni, Ru, Rh, Pd, Os, Ir, Pt, Cu, Zn, Ag and Au.

4. The device of claim 1 wherein the ratio of the full width at half maximum for the region in comparison with the full width at half maximum for monocrystalline silicon is 2 or less.

5. The device of claim 1 wherein the region is formed by selectively irradiating a laser light to the region.

6. A semiconductor device which employs a thin-film silicon semiconductor which is formed on an insulating surface, wherein
the thin-film silicon semiconductor has a region which can be regarded as being effectively monocrystalline,
the region constitutes at least part of an active layer,
and the region contains carbon and nitrogen atoms at a concentration of $5 \times 10^{18}$ cm$^{-3}$ or less, and oxygen at a concentration of $5 \times 10^{19}$ cm$^{-3}$ or less,
wherein Raman spectrum intensity ratio of the region in comparison with the Raman spectrum for monocrystalline silicon is at least 0.8.

7. The device of claim 6 wherein the region which has a crystalline construction which can be regarded as being effectively monocrystalline contains one or more metal elements which promote crystallization of the silicon, selected from Fe, Co, Ni, Ru, Rh, Pd, Os, Ir, Pt, Cu, Zn, Ag and Au.

8. The device of claim 6 wherein the region which has a crystalline construction which can be regarded as being effectively monocrystalline contains, at a concentration of between $1 \times 10^{16}$ and $5 \times 10^{19}$ cm$^{-3}$ one or more metal elements which promote crystallization of the silicon, selected from Fe, Co, Ni, Ru, Rh, Pd, Os, Ir, Pt, Cu, Zn, Ag and Au.

9. The device of claim 6 wherein the ratio of the full width at half maximum for the region in comparison with the full width at half maximum for monocrystalline silicon is 2 or less.

10. The device of claim 6 wherein the region is formed by selectively irradiating a laser light to the region.

11. A semiconductor device which employs a thin-film silicon semiconductor which is formed on an insulating surface, wherein
the thin-film silicon semiconductor has a region which can be regarded as being effectively monocrystalline,
the region constitutes at least part of an active layer,
and the region contains hydrogen atoms, which neutralize the unpaired bonds in the silicon, at a concentration of $5 \times 10^{20}$ cm$^{-3}$ or less,
wherein Raman spectrum intensity ratio of the region in comparison with the Raman spectrum for monocrystalline silicon is at least 0.8.

12. The device of claim 11 wherein the region which has a crystalline construction which can be regarded as being effectively monocrystalline contains one or more metal elements which promote crystallization of the silicon, selected from Fe, Co, Ni, Ru, Rh, Pd, Os, Ir, Pt, Cu, Zn, Ag and Au.

13. The device of claim 11 wherein the region which has a crystalline construction which can be regarded as being effectively monocrystalline contains, at a concentration of between $1 \times 10^{16}$ and $5 \times 10^{19}$ cm$^{-3}$ one or more metal elements which promote crystallization of the silicon, selected from Pe, Co, Ni, Ru, Rh, Pd, Os, Ir, Pt, Cu, Zn, Ag and Au.

14. The device of claim 11 wherein the ratio of the full width at half maximum for the region in comparison with the full width at half maximum for monocrystalline silicon is 2 or less.

15. The device of claim 11 wherein the region is formed by selectively irradiating a laser light to the region.

16. A semiconductor device which employs a thin-film silicon semiconductor which is formed on an insulating surface, wherein
the thin-film silicon semiconductor has a region which can be regarded as being effectively monocrystalline,
the region constitutes at least part of an active layer,
the region contains carbon and nitrogen atoms, at a concentration of $5 \times 10^{18}$ cm$^{-3}$ or less, oxygen atoms at a concentration of $5 \times 10^{19}$ cm$^{-3}$ or less, and hydrogen atoms, which neutralize the unpaired bonds in the silicon, at a concentration of $5 \times 10^{20}$ cm$^{-3}$ or less
th ethickness of the thin-film silicon semiconductor is on average between 200 and 2000 Å, and
Raman spectrum intensity ratio of the region in comparison with the Raman spectrum fro monocrystalline silicon is at least 0.8

17. The device of claim 16 wherein the region which has a crystalline construction which can be regarded as being effectively monocrystalline contains one or more metal elements which promote crystallization of the silicon, selected from Fe, Co, Ni, Ru, Rh, Pd, Os, Ir, Pt, Cu, Zn, Ag and Au.

18. The device of claim 16 wherein the region which has a crystalline construction which can be regarded as being effectively monocrystalline contains, at a concentration of between $1 \times 10^{16}$ and $5 \times 10^{19}$ cm$^{-3}$ one or more metal elements which promote crystallization of the silicon, selected from Fe, Co, Ni, Ru, Rh, Pd, Os, Ir, Pt, Cu, Zn, Ag and Au.

19. The device of claim 16 wherein the ratio of the full width at half maximum for the region in comparison with the full width at half maximum for monocrystalline silicon is 2 or less.

20. The device of claim 16 wherein the region is formed by selectively irradiating a laser light to the region.

21. A semiconductor device which employs a thin-film silicon semiconductor which is formed on an insulating surface, wherein
a region of the thin-film silicon semiconductor which has a crystalline construction which can be regarded as being effectively monocrystalline constitutes at least a channel-forming region,
and the channel-forming region contains carbon and nitrogen atoms at a concentration of $5 \times 10^{18}$ cm$^{-3}$ or less, oxygen atoms at a concentration of $5 \times 10^{19}$ cm$^{-3}$ or less, and hydrogen atoms, which neutralize the unpaired bonds in the silicon, at a concentration of $5 \times 10^{20}$ cm$^{-3}$ or less,
wherein Raman spectrum intensity ratio of the channel-forming region in comparison with the Raman spectrum for monocrystalline silicon is at least 0.8.

22. The device of claim 21 wherein the region which has a crystalline construction which can be regarded as being effectively monocrystalline contains one or more metal elements which promote crystallization of the silicon, selected from Fe, Co, Ni, Ru, Rh, Pd, Os, Ir, Pt, Cu, Zn, Ag and Au.

23. The device of claim 21 wherein the region which has a crystalline construction which can be regarded as being effectively monocrystalline contains, at a concentration of between $1 \times 10^{16}$ and $5 \times 10^{19}$ cm$^{-3}$ one or more metal elements which promote crystallization of the silicon, selected from Fe, Co, Ni, Ru, Rh, Pd, 0s, Ir, Pt, Cu, Zn, Ag and Au.

24. The device of claim 21 wherein the ratio of the full width at half maximum for the channel-forming region in comparison with the full width at half maximum for monocrystalline silicon is 2 or less.

25. The device of claim 21 wherein the channel-forming region is formed by selectively irradiating a laser light to the channel-forming region.

26. A semiconductor device which has a construction in which a plurality of thin-film transistors are connected in parallel, each of the plurality of thin-film transistors has a construction in which there are effectively no crystal grain boundaries within the channel-forming region, and the channel-forming region contains carbon and nitrogen atoms at a concentration of $5 \times 10^{18}$ cm$^{-3}$ or less, oxygen atoms at a concentration of $5 \times 10^{19}$ cm$^{-3}$ or less, and hydrogen atoms, which neutralize the unpaired bonds in the silicon, at a concentration of $5 \times 10^{20}$ cm$^{-3}$ or less, wherein Raman spectrum intensity ratio of the channel-forming region in comparison with the Raman spectrum for monocrystalline silicon is at least 0.8.

27. The device of claim 26 wherein the channel-forming region has a thickness of 200 to 2000 Å.

28. The device of claim 26 wherein the ratio of the full width at half maximum for the channel-forming region in comparison with the full width at half maximum for monocrystalline silicon is 2 or less.

29. The device of claim 26 wherein the channel-forming region is formed by selectively irradiating a laser light to the channel-forming region.

30. A semiconductor device which has a construction in which a plurality of thin-film transistors are connected in parallel, each of the plurality of thin-film transistors has a construction in which there are effectively no crystal grain boundaries within the channel-forming region, the channel-forming region has a thickness of between 200 and 2000 Å, and the channel-forming region contains carbon and nitrogen atoms at a concentration of $5 \times 10^{18}$ cm$^{-3}$ or less, oxygen atoms at a concentration of $5 \times 10^{19}$ cm$^{-3}$ or less, and hydrogen atoms, which neutralize the unpaired bonds in the silicon, at a concentration of $5 \times 10^{20}$ cm$^{-3}$ or less, wherein Raman spectrum intensity ratio of the channel-forming region in comparison with the Raman spectrum for monocrystalline silicon is at least 0.8.

31. The device of claim 30 wherein the ratio of the full width at half maximum for the channel-forming region in comparison with the full width at half maximum for monocrystalline silicon is 2 or less.

32. The device of claim 30 wherein the region is channel-forming formed by selectively irradiating a laser light to the channel-forming region.

33. A semiconductor device which has a construction in which a plurality of thin-film transistors are connected in parallel, and each of the plurality of thin-film transistors is constructed from a thin-film silicon semiconductor in which the channel-forming region can be regarded as being effectively monocrystalline, wherein Raman spectrum intensity ratio of the channel-forming region in comparison with the Raman spectrum for monocrystalline silicon is at least 0.8.

34. The device of claim 33 wherein the ratio of the full width at half maximum for the channel-forming region in comparison with the full width at half maximum for monocrystalline silicon is 2 or less.

35. The device of claim 33 wherein the channel-forming region is formed by selectively irradiating a laser light to the channel-forming region.

36. A semiconductor device which has a construction in which a plurality of thin-film transistors are connected in parallel, and each of the plurality of thin-film transistors has a construction in which there are effectively no crystal grain boundaries within the channel-forming region, wherein Raman spectrum intensity ratio of the channel-forming region in comparison with the Raman spectrum for monocrystalline silicon is at least 0.8.

37. The device of claim 36 wherein the ratio of the full width at half maximum for the channel-forming region in comparison with the full width at half maximum for monocrystalline silicon is 2 or less.

38. The device of claim 36 wherein the channel-forming region is formed by selectively irradiating a laser light to the channel-forming region.

\* \* \* \* \*

UNITED STATES PATENT AND TRADEMARK OFFICE
CERTIFICATE OF CORRECTION

PATENT NO. : 5,731,613 Page 1 of 1
DATED : March 24, 1998
INVENTOR(S) : Shunpel Yamazaki et al.

It is certified that error appears in the above-identified patent and that said Letters Patent is hereby corrected as shown below:

Column 10,
Line 51, change "A-A$^7$" to -- A-A' --.

Signed and Sealed this

Twenty-third Day of May, 2006

JON W. DUDAS
*Director of the United States Patent and Trademark Office*